May 30, 1961 B. T. BURSON ET AL 2,986,675

ELECTRONIC STRUCTURE

Filed June 30, 1958

*INVENTORS*
BAYARD T. BURSON
*BY* ALVIN I. MORRISON
Harry R. Lubcke
AGENT

United States Patent Office 2,986,675
Patented May 30, 1961

2,986,675

ELECTRONIC STRUCTURE

Bayard T. Burson and Alvin I. Morrison, Santa Ana, Calif., assignors to Engineered Electronics Company, Santa Ana, Calif., a corporation of California Filed June 30, 1958, Ser. No. 745,454
13 Claims. (Cl. 317—101)

Our invention relates to structures for electronic apparatus and particularly to unitized plug-in structures having optimized mechanical and electrical aspects.

In a number of electronic fields, such as the fields of computers, data handling devices, instrumentation, telemetering apparatus and automation control the apparatus is composed of discrete building blocks. These include flip-flops, multivibrators, amplifiers, emitter followers and diode logics.

Because of the complexity of the typical apparatus, unitization throughout the whole structure is highly desirable. With the socket plug-in configuration ready replacement of units and systematic socket wiring is possible.

In the units per se a high component packing density is desirable. This we have achieved by employing a minimum of mechanical supporting structure. A removable housing allows access to the several circuit components when the housing is removed and either partial or hermetic sealing when in place. A triple lock bayonet socket mechanical joinder of housing to base with a simple annular spring allows firm engagement and ready disengagement of these parts. A stacked wafer contact-and-support internal structure accomplishes both electrical and mechanical functions. An internal resilient insulating liner holds the wafers mechanically to prevent motion under conditions of vibration. The liner also provides electrical insulation between the housing and the internal electrical components. Etched or printed circuitry is preferably employed upon the wafers to provide conductive terminals and to interconnect these terminals. The unit may be assembled and disassembled for internal inspection substantially without tools, only a rigid pointed element, such as a pin or a piece of stiff wire comprising a convenient tool for initially dislodging the annular retaining spring. The unit may also be disassembled by using one's fingernail to release the spring.

While our structure is suitable for any combination of present day electronic components of small size it has been particularly used for transistor devices. With such it has been possible to assemble a reset-set-trigger type flip-flop in the volume occupied by the usual miniature size vacuum tube. Convenient in standardization is the fact that a miniature vacuum tube socket is used for mounting and that a spring retaining miniature vacuum tube shield may be used to retain the unit in the socket under conditions of extreme vibration.

Our advance is apparent over prior art devices having a less dense useful component packing density, those solidly potted in insulating material so as to be unrepairable, those which require a plurality of small screws for fastening principal parts and those which require relatively heavy central or other main structural members.

An object of our invention is to provide a unitized electrical circuit having a high density of electrical components.

Another object is to provide a sealed unitized electronic circuit apparatus which may be unsealed for repair and then resealed.

Another object is to provide an electrical circuit embodiment which has high structural strength in relation to the weight of purely structural members.

Another object is to provide an electrical circuit encasing structure which may be dismantled without tools.

Another object is to provide a whole electrical circuit, or even plural electrical circuits, in the volume occupied by a miniature vacuum tube of the prior art and to be mechanically interchangeable with such a vacuum tube.

Another object is to provide a light-weight assembly of electronic components.

Other objects will become apparent upon reading the following detailed specification and upon examining the accompanying drawings, in which are set forth by way of illustration and example certain embodiments of our invention.

Figure 2:
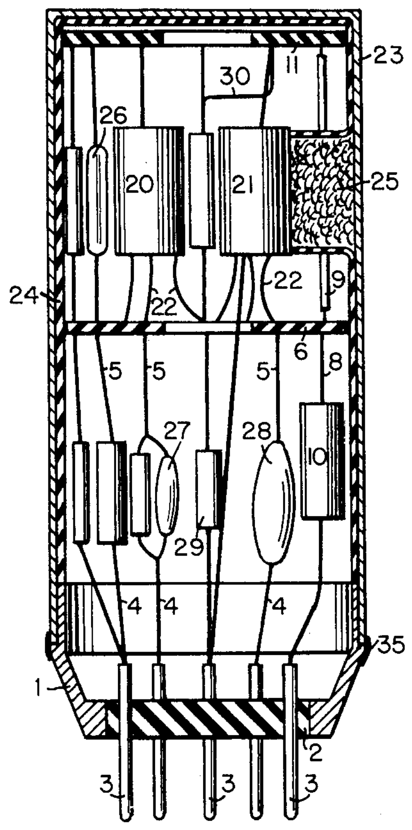
Fig. 2 shows an enlarged elevation view of our assembled electronic structure in section.

In Fig. 2 numeral 1 indicates the base or support means of our electronic structure. This is a hollow cylindrical member having a lower tapered portion and an enclosing bottom in which an insulating section 2 is found. The base may be formed from cold rolled steel suitably hot tin dipped. The insulating section is preferably a glass-like header cast within the base and held under compression upon cooling. A plurality of pins 3 are cast into the insulating section and are tightly held therein. Fig. 2 has been shown approximately three times normal size for sake of clarity. The number and arrangement of pins 3 preferably duplicates that found in the known miniature vacuum tube pins, in lying around the periphery of a ⅝″ diameter circle and having nine pins and one space for orienting. Of course, known 7 pin, 13 pin or 14 pin configurations may also be utilized. The completed electronic structures are conveniently connected to other circuits by insertion in known miniature tube sockets. Such sockets also form convenient wrenches for manipulating the structure in disassembly and repair.

A different plurality of electronic circuit components surmounts the pins 3. According to the connections required and the complexity of the particular circuit embodied this plurality may be equal to, greater than or less than the number of pins. The lower lead wires or pig-tails 4 of the components are soldered, spot-welded, crimped or otherwise rigidly and conductively fastened to the pins 3. Fig. 2 is shown in section and therefore only half of the normal number of components are shown. In the full embodiment the relatively short length, the number and the individual rigidity of these lead wires are such as to make a rigid structure when the top lead wires 5 are firmly attached to a surmounting wafer or disk 6.

Figure 1:
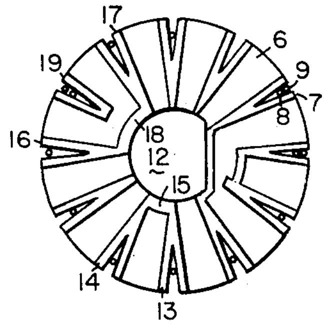
Fig. 1 shows a plan view of a top wafer member of our structure.

A plan view of such a wafer is shown in Fig. 1. It is formed of a phenolic, an epoxy glass laminate or a ceramic and may be metallic-coated originally with a metal such as copper monolithically bonded to the material of the wafer over the whole surface. The excess copper is removed by the etched circuit process known to the art.

A typical metal contact or terminal is shown at 7 in Fig. 1. It has a V shape with the larger part of the V at the periphery of the wafer. Two connecting lead wires 8 and 9 are shown within the open slot of the V. The insulating wafer body has been cut out at each of these slots around the periphery of the wafer.

In Fig. 2, wire 8 is noted as the top pig-tail of resistor 10 while wire 9 is merely an insulated conductor extending from the lower wafer 6 to an upper wafer 11, there to interconnect to another terminal thereon as called-for by the particular circuit of the electronic structure.

Wafer 6 has an inner hole 12 which allows connecting wires to pass therethrough and also serves to lighten the member. A D-shaped hole is preferred so that an index is provided for assembling plural wafers. By employing a flattened circular mandrel as an aid in assembly, the wafers are automatically correctly oriented and are prevented from turning. Two adjacent V terminals 13 and 14 have an etched circuit connection 15 electrically connecting the two as a part of the particular circuit involved. Similarly, two other non-adjacent V terminals 16 and 17 have an etched circuit connection 18 for the same reason. Intervening V terminal 19 is shortened in inward radial extent so that contact will not be made with the inner circumferential connection 18. The D slot allows even two such circumferential connections at that portion of the wafer. In this way portions of the circuitry are connected upon the wafers, accomplishing an over-all simplification.

Fig. 2 shows a characteristic embodiment in having two tiers of components and two wafers or insulating members. This amount of circuitry is required in most of the circuits initially mentioned herein. In manufacture the lower tier of components is first connected to base pins 3 and then wafer 6 connected in place. The upper tier of components and upper wafer 11 are separately assembled as a sub-assembly. The two are then joined as the completed structure by soldering the lower pig-tails of the upper tier to the several V contacts of wafer 6. As shown in Fig. 1, the lower pig-tail 8 is farthest inside the V slot while the upper connection 9 is to the outside from that connection. While soldering has been mentioned directly above, and is the usual mode of assembly, the other methods such as spot-welding or crimping previously mentioned may be used throughout the assembly.

The electronic structure may be composed of a wide variety of electrical components. These may be all passive, such as resistors, capacitors, inductors, small transformers, potentiometers and piezo crystal elements. Usually, however, in order to fabricate flip-flops, multivibrators, amplifiers and similar units, active elements are required. These latter may be transistors or subminiature vacuum tubes. In Fig. 2 two transistors 20, 21 are shown in the upper tier of components. Two such triode transistors are normally required to fabricate the circuits mentioned. The three leads from each, generally indicated by numerals 22, are connected to the necessary associated passive components at the appropriate V connections.

It is known that transistors dissipate relatively little heat because of the absence of the heater or filament found in the usual vacuum tube. We have determined that in nearly every use of transistors in our electronic structure special means to dissipate the heat thereof to ambient surroundings have not been required. Our measurements show that the heat dissipation of fifty electronic structures employing transistors does not exceed the heat dissipated by only one equivalent circuit employing a miniature vacuum tube.

However, power transistors are well known, and though without heaters the heat generated by the relatively large current flow through the resistance of the transistor junctions does call for special means for conducting it to the outside case. This is shown in Fig. 2, where a metal "wool" 25, such as aluminum, copper, or perhaps steel is packed between the power transistor and the housing.

Housing 23 is normally a deep drawn, seamless aluminum cylinder having a closed top and an open bottom. It is provided with an insulating liner 24, which may be of semi-resilient plastic. It may be formed as a complete cup or as an upper disk and an open-ended cylinder.

When metal wool 25 is required liner 24 is slit adjacent to the place to be occupied by the wool and is bent toward the transistor. This serves the dual purpose of placing the wool in contact with the metal housing 23 for efficient transmission of heat thereto and hence by radiation, conduction and convection to the exterior surroundings, and also to retain the wool in the proper position. In such an event the liner is preferably mounted on the component assembly first and the outer can or housing slipped over the two. Otherwise, the liner is preferably integral with the housing, either by a snug mechanical fit or by a small amount of suitable adhesive applied between the liner and housing.

Completing the illustrative description of the electronic components of the structure, numeral 26 indicates a glass-enclosed semiconductor diode, 27 and 28 disk type ceramic capacitors, and 29 a resistor of the same type as resistor 10 but of a smaller wattage rating. It will be understood that while the general scheme of our electron structure embraces vertically disposed components and lead wires, exception to the vertical arrangement may be taken whenever required and the components or leads thereto may be inclined or horizontal. One such situation is shown with respect to lead 30 in the flip-flop circuit illustrated.

Figure 3:
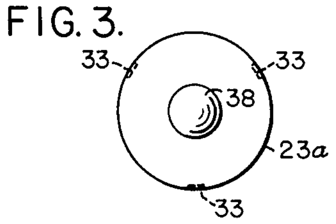
Fig. 3 shows a top plan view of an alternate embodiment.
Figure 4:
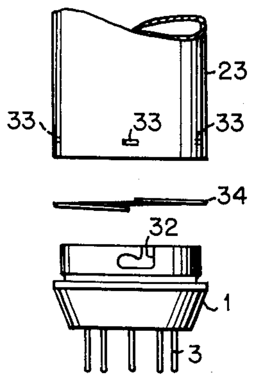
Fig. 4 shows a fragmentary disassembled view of the base assembly.

The mechanical arrangement for securing the housing to the base is shown in Fig. 4. A three J slot configuration is used. One such slot 32 may be seen in Fig. 4, the other two are on the rear of the cylindrical surface and cannot be adequately shown. The spacing is preferably equi-angular, at 120°, as can be noted by the dotted peripheral showings in the plan view, Fig. 3. In Fig. 4, three dimples, or indentations, 33 are shown in the lower part of housing 23. Each one of these coacts with the correspondingly spaced J slot, allowing the housing to be pressed down over the reduced diameter of the upper portion of base 1. With a slight clockwise rotation the dimples engage the left hand portions of the slots. Spring ring, or annular resilient element, 34 fits between the bottom of housing 23 and the central flange of base 1. When the dimples are at the left hand portions of the J slots the axially exerted force of the spring ring holds the housing to the base. Furthermore, the presence of the spring ring between the two prevents a counterclockwise rotation to loosen the parts. The spring ring is thus installed after the housing and base have been rotated to the holding portion of the J slots and must be removed before these parts can be disengaged. This removal can be accomplished with the point of a pin, a wire, or even a sharp finger-nail, but is not subject to dislodgement by any handling otherwise expected for the structure. A convenient manner of installing the spring ring is either to expand it over the conical bottom of base 1 or to place it around the case 23 before it is joined to the base 1. By reversing the direction of the lower part of slot 32 the fastening of the housing may be accomplished by a slight counterclockwise rotation.

It will be appreciated that this type of fastening will provide a spray and drip-proof enclosure. The overlapping cylindrical portions of the housing and upper base present a devious path to moisture. For a hermetically sealed enclosure we merely apply a suitable sealing compound to this joint. While this may be solder or Wood's metal which can be melted to allow unfastening by heat we prefer to employ either of two types of non-metallic substances. One of these is an epoxy that is painted on prior to final assembly and is returned to the liquid state by partial immersion in a shallow pan of epoxy solvent, such as that known as H866A. The epoxy may also be softened by the application of mild heat, as with a fan driven electric dryer with the heat applied through a small nozzle. The epoxy makes a firm bond with the metal.

The other sealing substance is liquid vinyl. This makes a rubber-like enclosure over the joint of the spring ring, as shown at 35 in Fig. 2. This substance is similar to fingernail polish and can be peeled off with a knife when the structure is to be unsealed for repair. The vinyl does not make a bond with the metal but remains in place because of the characteristic of shrinking upon drying.

When the epoxy is used it is applied completely around the joint as shown at 35 but not so extensively laterally.

Fig. 3 illustrates the top view of an alternate to the structure of Fig. 2 in that a neon or equivalent indicator 38 protrudes from a hole in the top of housing 23*a*. The purpose of the indicator is to show that the particular circuit is conducting or, alternately, non-conducting, as practiced in the electronic computer arts.

With respect to the location of transistors, the central upper location shown in Fig. 2 is preferred in order that space may be most effectively used. We have found that the transistors may be easily removed for replacement by merely unsoldering one or two outer positioned circuit components at one end thereof and bending these out of the way. Then the transistor leads are unsoldered and the transistors removed. A new transistor is installed by the reverse process. As an alternate to the central manner of mounting, the transistors may be mounted around the periphery of the wafers like the other components and in circuits where a large number of components are required the resistors and other passive elements may be centrally mounted instead.

A number of alternate embodiments of our invention are possible.

Figure 5:
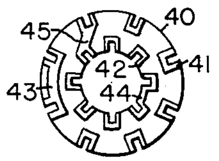
Fig. 5 shows a plan view of an alternate disk member of our structure.

Principal among these is that shown in Fig. 5. This is an alternate kind of wafer in which circuit conductors are soldered around the periphery of an inner hole as well as around the outer periphery. The slots are of a U-shape rather than of a V-shape.

Specifically, the insulating piece 40 may be constructed of any of the insulating materials mentioned. According to any of the methods also described metallic areas are formed around the slots, as at 41 and 42. These conductive areas are also extended between the different slots to effect circuit connections, as on the outer periphery at 43, on the inner periphery at 44 and between the outer and inner peripheries at 45.

This arrangement is of particular utility when the components attached to the outer periphery are of small cross-sectional size. In such cases the addition of components around the inner periphery maintains high component packing density, which characterizes our invention.

Through the use of unijunction type semiconductors the circuits for certain computer devices can be simplified and only one disk and a lower tier of components will suffice. Accordingly, only approximately one-half or one-third of the height shown in Fig. 2 is required, the structure in effect being cut off directly above wafer 6.

Conversely, for complicated circuits or more than one circuit in one housing the tiers may be increased to three or more. In some instances three tiers can be accommodated in the same height as for two, while in other instances the height of the housing 23 is increased as necessary.

Where dissimilar metal contacts are to be avoided, base 1 may be made of an aluminum, such as 63STW. In this case a phenolic or other insulating compound is used that does not require a high heat for fusion as does the glass-like material previously described.

It is also possible to form the base 1 and insulator 2 as one piece of insulating material, preferably by a molding process in which pins 3 are embedded. The cross-sectional area of base 1, as shown in Fig. 2, is increased to provide equivalent mechanical strength in this alternate embodiment.

As alternates to the wafer and metal combination previously mentioned, silver or copper may be printed upon the wafer insulation by known printed circuit techniques, including screening. These metals may also be plated or fired on the wafer. As another alternate, small eyelets may be secured around the periphery of the wafer instead of the V or U contacts previously described and an open slot punched in the outer side of each, so that in effect a V or U contact is formed.

In addition to the wafer materials previously mentioned Teflon has been used as an alternate material. While there is no theoretical limit to the frequency of operation of the electronic circuits of our structure the usual computer performance desired involves frequencies of less than one megacycle. However, operation to frequencies above ten megacycles is envisaged and for such frequencies the Teflon insulation is of some advantage. At these frequencies stray capacitances are important, but the low impedance characteristic of transistor circuits as compared to the usual vacuum tube circuits tends to remove the effects of stray capacitances. Accordingly, the relatively high packing density we have achieved by eliminating mechanical supports gives proper functioning even for relatively high frequency circuits.

An alternate to metal wool cooling of power transistors consists in providing such transistors with black radiating structures of aluminum or equivalent metal. These radiators are either placed in contact with housing 23 or very close thereto in order to dissipate heat externally.

Also, metal wool may extend through the D hole in the upper wafer and contact the top of the case. In such an alternate a thin tube of insulating material is preferred to contain the wool and to prevent shorting contacts or connections on the upper wafer.

Still other modifications in the arrangement, size, proportions and shape of our electronic structure may be made and other materials of approximately equivalent mechanical and electrical characteristics substituted for those disclosed without departing from our invention.

Having thus fully described our invention and the manner in which it is to be practiced, we claim:

1. A repairable electrical structure comprising a base having plural external contact means, plural circuit elements having connections attached only to said contact means, a circular insulating piece having plural monolithically formed radially disposed slotted contacts surmounting said base, further connections of said circuit elements oppositely disposed with respect to prior said connections connected to said slotted contacts and constituting exclusive means to space said insulating piece from said base, a second circular insulating piece having similar contacts and surmounting said insulating piece, a second plurality of circuit elements having connections, the connections of said second plurality of circuit elements connected only between said insulating piece and said second insulating piece to constitute exclusive means to space said insulating pieces, an internally insulated housing to enclose and to laterally support the recited structure proportioned to fit around said base, and a slot-single-spring annular assembly to fasten said housing to said base.

2. The structure of claim 1 in which said insulating piece and said second insulating piece have aligned indexing D-shaped holes therein.

3. The structure of claim 1 in which said insulating piece and said second insulating piece each have central holes with plural inwardly radially disposed slotted contacts around the periphery of each of said holes and a third plurality of circuit elements having connections connected therebetween.

4. The structure of claim 1 in which the end of said housing opposite said base has a hole therein, an electrical indicator, said electrical indicator connected to at least one of said circuit elements and disposed within said hole to give an indication external to said housing of the electrical state of said circuit element.

5. The structure of claim 1 in which said insulating piece and said second insulating piece are coaxially aligned disks, said slotted contacts are etched metal and monolithically formed etched circuit conductors connect between at least two of said contacts to provide a part of the electrical circuit.

6. An electrical structure comprising a base having plural fastening slots and a plurality of external contacts, a plurality of electrical components electrically connected exclusively to said contacts, a circular insulating disk surmounting said electrical components, said disk having a plurality of circumferential electrical contacts, said plurality of electrical components also exclusively connected to said electrical contacts to exclusively support said disk, a further plurality of electrical components also connected to said electrical contacts, a second circular disk having a plurality of circumferential electrical contacts, said further plurality of electrical components also exclusively connected to said electrical contacts to exclusively support said second disk; a cylindrical housing proportioned to enclose the recited structure having an open end, plural projections adjacent to said open end positioned to enter said fastening slots and fasten said housing to said base, and only one circumferential spring fittable between the open end of said housing and the said base to removably lock said housing to said base.

7. A repairable plug-in electronic structure comprising a cylindrical base having three bayonet socket apertures and a plurality of grouped lead-through contact pins, a plurality of passive and active electrical circuit components metallically bonded exclusively to said pins, an insulating wafer having a D-shaped hole surmounting said electrical components, said wafer having a plurality of peripheral electrical contacts monolithic with said wafer, said plurality of electrical components also metallically bonded to said peripheral contacts to constitute the only support of said wafer, a further plurality of electrical components also metallically bonded to said peripheral contacts, a second wafer having a plurality of said peripheral contacts, said further plurality of electrical components also metallically bonded to said peripheral contacts of said second wafer to surmountingly exclusively support the same, at least one interconnection monolithically formed upon said two of said wafers between at least two of said peripheral contacts; an outer hollow housing proportioned to closely enclose the recited structure, said housing having one open end, resilient metallic wool to thermally connect a said active electrical component to said housing, three indentations adjacent to said open end positioned to enter said three bayonet socket apertures to fasten said housing to said base, only one annular spring ring proportioned to fit between the open end of said housing and a flange of said base to lock said bayonet structure, a resilient insulating liner within said housing proportioned to bear against said wafers and said housing to form a unitary mechanical structure, and a sealing agent disposed around said spring ring to hermetically seal said electronic structure.

8. A dismountable electronic circuit element structure comprising a cylindrical base having plural grouped insulated external contacts, plural circuit elements electrically attached to said contacts for also exclusive mechanical support of said elements, a circular insulating piece having plural monolithic radially disposed slotted metalized contacts, said circuit elements electrically connected to said slotted contacts to exclusively mechanically support said insulating piece, a second circular insulating piece having similar contacts, a second plurality of circuit elements electrically connected between said insulating pieces to exclusively mechanically support said second insulating piece, a rigid case proportioned to house the recited structure and to fit upon said base, plural slot means to fasten and only one circumferential spring means to retain said case to said base, and resilient insulating means laterally within said case bearing upon said insulating pieces to supportively restrain the recited structure therewithin.

9. The structure of claim 8 in which said plural slot means to fasten comprise J slots in said base and coactive projections in said case and said spring means comprises a compressible locking ring interposed between said case and said base.

10. The structure of claim 8 in which said circuit element structure is sealed by a material bonded to said base and to said case at the junction therebetween.

11. The structure of claim 8 in which said circuit element structure is sealed by a material externally covering the junction between said base and said case which shrinks subsequent to application.

12. The structure of claim 8 in which at least one of said plural electrical elements produces heat, said case is heat conductive and a mechanically-resilient thermally-conductive material is interposed directly between said one element and said case to conduct said heat to said case.

13. An electronic structure comprising a conical base having bayonet slots and a group of external contact pins, a plurality of electrical components having oppositely disposed conductive leads, one group of said leads conductively connected to said pins, an insulating cylindrical wafer surmounting said electrical components, said wafer having a plurality of electrical contacts, the opposite group of said leads of said plurality of electrical components conductively connected to said electrical contacts to mechanically support said wafer, a further plurality of electrical components also having conductive leads conductively connected to said electrical contacts, a second cylindrical wafer having a plurality of electrical contacts opposite conductive leads of said further plurality of electrical components conductively connected to the electrical contacts of said second wafer to mechanically support said second wafer, at least two interconnections monolithically formed upon at least one of said wafers between a said plurality of said electrical contacts; a housing proportioned to enclose the recited structure having an open end, dimples adjacent to said open end of said housing positioned to enter said bayonet slots and to join said housing to said base, an annular spring shaped to fit between the open end of said housing and said base to lock these elements, and an insulating liner within said housing to resiliently support and to electrically insulate said electrical contacts from said housing.

References Cited in the file of this patent

UNITED STATES PATENTS

| | | |
|---|---|---|
| 1,676,744 | Pickard | July 10, 1928 |
| 2,526,834 | Traugott | Oct. 24, 1950 |
| 2,574,783 | Hedding | Nov. 13, 1951 |
| 2,614,243 | Clark | Oct. 14, 1952 |
| 2,628,270 | Himmel | Feb. 10, 1953 |
| 2,699,133 | Ames | Jan. 11, 1955 |
| 2,737,579 | Wehrlin | Mar. 6, 1956 |
| 2,774,014 | Henry | Dec. 11, 1956 |

FOREIGN PATENTS

| | | |
|---|---|---|
| 1,156,246 | France | May 13, 1958 |